(12) United States Patent
Hara et al.

(10) Patent No.: US 6,777,932 B2
(45) Date of Patent: Aug. 17, 2004

(54) MAGNETIC FIELD SENSOR

(75) Inventors: Jun-ichiro Hara, Fuchu (JP); Tadata Hatanaka, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 235 days.

(21) Appl. No.: 09/812,791

(22) Filed: Mar. 20, 2001

(65) Prior Publication Data

US 2003/0205996 A1 Nov. 6, 2003

(30) Foreign Application Priority Data

Mar. 23, 2000 (JP) ........................................ 2000-082115

(51) Int. Cl.[7] .............................................. G01R 33/06
(52) U.S. Cl. .................................. 324/251; 324/117 R
(58) Field of Search .............................. 324/251, 207.2, 324/235, 117 H, 117 R; 327/510, 511

(56) References Cited

U.S. PATENT DOCUMENTS

| | | | |
|---|---|---|---|
| 4,037,150 A | 7/1977 | Taranov et al. | ............. 324/251 |
| 5,604,433 A | 2/1997 | Theus et al. | ................. 324/251 |
| 5,619,137 A | 4/1997 | Vig et al. | ..................... 324/251 |
| 5,621,319 A | 4/1997 | Bilotti et al. | ................ 324/251 |

FOREIGN PATENT DOCUMENTS

| | | |
|---|---|---|
| EP | 0 793 075 A1 | 9/1997 |
| JP | 8-201491 | 8/1996 |
| WO | 99/21023 | 4/1999 |

*Primary Examiner*—Jay Patidar
*Assistant Examiner*—Vincent Q. Nguyen
(74) *Attorney, Agent, or Firm*—Pearne & Gordon LLP

(57) ABSTRACT

A magnetic field sensor including an amplifier and a magnetic field element for outputting a signal to a switch circuit according to the strength of an applied magnetic field. The switch circuit outputs a signal selected by an external two-phase signal to an amplifier that amplifies the signal and outputs a resulting voltage to a first end of a memory element. A switch, having one end connected to a second end of the memory element, is controlled by the two-phase signal. The switch closes in a first phase of the two-phase signal causing the memory element to store the output voltage of the amplifier, and opens in a second phase causing a vector sum of the output voltage the amplifier to be stored in the memory element and providing the output voltage to a signal output terminal connected to the second end of the memory element.

8 Claims, 8 Drawing Sheets

MAGNETIC FIELD SENSOR

BACKGROUND OF THE INVENTION

The present invention relates to a magnetic field sensor which comprises a Hall element and an amplifier for amplifying the output voltage of the Hall element and which detects the magnetic field strength in the installed location so as to output a signal in accordance with the detected magnetic field strength.

A typical magnetic field sensor is a bipolar IC or a CMOS IC which include a Hall element for outputting an output voltage proportional to the magnetic field strength and an amplifier for amplifying an output voltage of the Hall element as well as a comparator for inputting the output voltage of the amplifier to be compared with a reference potential and for outputting the comparison result. Such a magnetic field sensor outputs an output signal of two values (0 or 1) showing whether the magnetic field strength of the location where the magnetic field sensor is installed is larger or smaller than a constant reference.

Another magnetic field sensor comprises a Hall element for outputting the output voltage proportional to the magnetic field strength and an amplifier for amplifying the output voltage of the Hall element and outputs the output signal of that amplifier as an analog signal, without change.

One of the major factors of dispersion in characteristics among the products of the magnetic field sensor is the dispersion of the offset signal component included in the output voltage of the Hall element. This occurs due to the stress, or the like, which is received by the Hall element body from the package. Another one is an offset signal component which exists at the input terminal of the amplifier (in general, a differential amplifier).

U.S. Pat. No. 4,037,150 discloses a technology which makes the influence of the offset signal component of the Hall element be small. A magnetic field sensor according to the invention described in U.S. Pat. No. 4,037,150 has a Hall element in a plate form with four terminals and the form of a Hall element is geometrically equal, as is that of the Hall element 1 described in FIGS. 5 and 6.

"Geometrically equal forms" means that the form under the condition of FIG. 5 and the form under the condition where the Hall element of FIG. 5 is rotated by 90 degrees (it is rotated so that A–A' agrees with B–B' in FIG. 5) are the same, as is the Hall element 1 described in FIG. 5.

A description is made in reference to FIG. 5. The Hall element has two pairs of terminals A–A' and B–B' in the diagonal direction. In the first phase (first timing) a power source voltage is applied across the terminals A–A' and the output voltage across the terminals B–B' is detected so as to be stored in memory. Next, a power source voltage is applied across the terminals B–B' at the second phase (second timing) and the output voltage across the terminals A–A' is detected so as to be stored in memory. The switching of these actions is implemented by the switch circuit 24.

Here, a circuit for applying a power source voltage to the Hall element is not shown in every figure.

The timing chart for the first and the second phases is described in FIG. 7. A sum is gained between an output signal of the first phase and an output signal of the second phase and, then, an effective signal component of an output signal of the Hall element is added in the same phase so as to be doubled while an offset signal component of an output signal of the Hall element is added in the negative phase so as to be mutually canceled. In this manner, the influence given to the output signal by the offset signal component of the Hall element is suppressed.

Next, the configuration of a conventional magnetic field sensor which compensates the offset signal component due to the input offset of the amplifier is described in reference to FIGS. 5 and 6.

FIG. 5 shows a configuration of a magnetic field sensor according to the first prior art as disclosed in the Japanese unexamined patent publication H8(1996)-201491. In FIG. 5, a Hall element is denoted as 1, a switch circuit is denoted as 24, capacitors which are memory elements are denoted as 4 and 6, switches are denoted as 5 and 8, voltage-current conversion amplifiers, each of which has high input and output impedance and converts a input voltage into a current so as to be outputted, are denoted as 10 and 11, and a resistance is denoted as 12.

In the first phase, the first phase signal (a) which has a pulse is given to the switch 5 while in the second phase, the second phase signal (b) which has a pulse is given to the switch 8. In addition, the first and the second phase signals are given to the switch circuit 24.

The relationship between the first phase and the second phase in the first prior art is shown in FIG. 7.

The operation in the first phase is described.

In the first phase the switch 5 is closed while the switch 8 is open. At this time, a power source voltage is applied across the terminals A–A' of the Hall element 1 so that the output voltage across the terminals B–B' is outputted through the switch circuit 24. The output voltage of that Hall element 1 is inputted to the voltage-current conversion amplifier 10.

The voltage-current conversion amplifier 10 outputs a current which is proportional to the output voltage of the Hall element 1. The output current IOUT of the voltage-current conversion amplifier 10 is represented as in the following equation.

$$IOUT = \alpha(Vh + Voff10) \qquad (1)$$

Voff10 is an input offset voltage of the voltage-current conversion amplifier 10 and Vh is an output voltage of the Hall element (input voltage of the voltage-current conversion amplifier 10). α is a conversion coefficient (proportional constant) from voltage to current.

The resistance value of a Hall element has a great dispersion among products. In general, when the resistance value of a Hall element is small, the output voltage of the Hall element becomes large and when the resistance value of the Hall element is large, the output voltage of the Hall element becomes small.

This current flows into the capacitors 4 and 6 via the switch 5. A voltage-current conversion amplifier 11 which has the same functions as the amplifier 10 generates a current which is proportional to a differential voltage between the charging voltage of the capacitor 4 and the charging voltage of the capacitor 6 and which is in the opposite direction to the direction of a current of the voltage-current conversion amplifier 10. Charging current to the capacitors 4 and 6 stops when the sum of the respective output currents of the voltage-current conversion amplifiers 10 and 11 becomes zero. At this time, since the directions of the output currents of the respective voltage-current conversion amplifiers 10 and 11 are opposite to each other, the absolute values of the respective output currents of the voltage-current conversion amplifiers 10 and 11 agree.

Accordingly, the output current IOUT2 of the voltage-current conversion amplifier 11 can be represented in the following equation.

$$IOUT2 = -\alpha(Vh + Voff10) \quad (2)$$

Next, the operation in the second phase is described.

In the second phase, the switch 5 is open and the switch 8 is closed. At this time, since the charging and discharging currents for the capacitors 4 and 6 do not flow, the capacitors 4 and 6 maintain the charges (accordingly, voltage) stored in the first phase. Accordingly, the voltage-current conversion amplifier 11 makes the current of the same value as of the current in the first phase keep flowing. The output current IOUT2 of the voltage-current conversion amplifier 11 is represented in the equation (2).

At this time, a power source voltage is applied across the terminals B–B' of the Hall element 1 so that the output voltage across the terminals A–A' is outputted through the switch circuit 24. The output voltage of that Hall element 1 is inputted into the voltage-current conversion amplifier 10. The output signal of that Hall element which has been inputted into the voltage-current conversion amplifier 10 is substantially in the opposite direction to that at the time of the first phase. Accordingly, at this time, the output current of the voltage-current conversion amplifier 10 becomes of the same amount and of the same polarity as of the output current of the voltage-current conversion amplifier 11.

The output current IOUT1 of the voltage-current conversion amplifier 10 in the second phase can be represented in the following equation.

$$IOUT1 = \alpha(-Vh + Voff10) \quad (3)$$

The sum current of the output currents of the voltage-current conversion amplifiers 10 and 11 flows into the resistance 12 via the switch 8.

Therefore, the current I which flows into the resistance 12 is gained by adding the equation (2) and the equation (3) as:

$$I = IOUT1 + IOUT2 = -2\alpha Vh \quad (4)$$

which shows that the input offset voltage Voff10 is canceled.

FIG. 6 shows the second configuration example of a conventional magnetic field sensor. In FIG. 6, a Hall element is denoted as 1, a switch circuit is denoted as 24, a voltage amplifier is denoted as 25, capacitors which are memory elements are denoted as 4 and 6, and switches are denoted as 5, 8 and 9. The capacitance values of the capacitors 4 and 6 are equal.

The relationship among the first phase, the second phase and the third phase according to the second prior art is shown in FIG. 8.

The operation in the first phase is described.

In the first phase, the switch 5 is closed while the switches 8 and 9 are open.

At this time, power source voltage is applied across the terminals A–A' of the Hall element 1 so that the output voltage across the terminals B–B' is outputted through the switch circuit 24. The output voltage of that Hall element 1 is inputted into the voltage amplifier 25.

The voltage amplifier 25 outputs the voltage proportional to the output voltage of the Hall element 1. The output voltage V1 of the voltage amplifier 25 in the first phase can be represented in the following equation.

$$V1 = \beta(Vh + Voff25) \quad (5)$$

Voff25 is an input offset voltage of the voltage amplifier 25 and Vh is an output voltage of the Hall element (input voltage of the voltage amplifier 25). β is a voltage amplification factor of the voltage amplifier 25.

The capacitor 4 is charged to the output voltage V1 of the voltage amplifier 25 via the switch 5.

Next, the operation in the second phase is described.

In the second phase, the switch 8 is closed while the switches 5 and 9 are open.

A power source voltage is applied across the terminals B–B' of the Hall element 1 so that the output voltage across the terminals A–A' is outputted through the switch circuit 24. The output voltage of that Hall element 1 is inputted into the voltage amplifier 25. An output signal of that Hall element which is inputted into the input terminal of the voltage amplifier 25 becomes substantially of the opposite direction to that at the time of the first phase. Accordingly, at this time, the output voltage V2 of the voltage amplifier 25 can be represented in the following equation.

$$V2 = \beta(-Vh + Voff25) \quad (7)$$

The capacitor 6 is charged to the output voltage V2 of the voltage amplifier 25 via the switch 8.

Finally, the operation in the third phase is described.

In the third phase, the switch 9 is closed while switches 5 and 8 are open.

Both terminals of the capacitor 4 are made to cross each other via the switch 9 and are connected in parallel with both terminals of the capacitor 6. As a result, the average value of the voltage −V1, across the terminals of the capacitor 4, and the voltage V2, across the terminals of the capacitor 6, is outputted to the output terminal. Since the capacitance values of the capacitors 4 and 6 are the same, that output voltage V is represented in the following equation.

$$V = (-V1 + V2)/2 = -\beta Vh \quad (8)$$

Here, it is seen that the input offset voltage Voff25 of the voltage amplifier 25 is canceled.

The voltage amplifier 25 of the magnetic field sensor, which utilizes a Hall element, outputs the first output signal which is a signal gained by amplifying the output signal across the two mutually facing terminals of the Hall element with four terminals in the first phase. The voltage amplifier 25 outputs the second output signal which is a signal gained by amplifying the output signal across the other two mutually facing terminals of the Hall element with four terminals in the second phase. This second output signal is substantially a signal gained by inverting the first output signal. In this manner, the voltage amplifier of a magnetic field sensor which utilizes a Hall element cancels the input offset voltage Voff25 of the voltage amplifier 25 by outputting signals in the first phase and in the second phase which are in a substantially inverted relationship.

Since the output voltage of the Hall element is outputted as a differential voltage between the two terminals of the Hall element, conventionally the differential voltage of the Hall element is inputted into a differential amplifier so that the differential amplifier outputs a non-inverted (plus) output signal and an inverted (minus) output signal.

Therefore, an amplifier of a conventional magnetic field sensor is a double output-type amplifier which has a non-inverted output terminal and an inverted output terminal as shown in FIG. 5 or 6.

When the double output-type amplifier is used, however, the output part has a large number of component elements and a large chip area is occupied.

In a conventional configuration, there is the defect that the circuit scale for canceling the input offset voltage is large.

In addition, a magnetic field sensor has been used in products which are battery operated, such as cellular phones, in recent years and, therefore, the reduction of the consumption current of the magnetic field sensor is becoming an important technical problem. As for the means used for the reduction of the consumption current, it is general to adopt an intermittent operation which makes the consumption current be zero during a constant time by using a counter, or the like.

However, there is a constraint in the time wherein the sensor operation can be stopped depending on the sets using the magnetic field sensor and, therefore, it becomes a problem of in how many steps one sensing operation can be implemented. More concretely, in the first prior art, the magnetic field strength can be measured in the two steps of the first and the second phases. In the second prior art the magnetic field strength can be measured in the three steps of the first to the third phases.

The present invention is intended to solve the above described conventional problem and has the purpose of providing a magnetic field sensor which reduces the dispersion of the output voltage for detecting the magnetic field strength and which consumes a small amount of power and is inexpensive.

SUMMARY OF THE INVENTION

The invention according to claim 1 of the present invention is a magnetic field sensor comprising:

a Hall element for outputting a signal in accordance with an applied magnetic field strength to an output terminal;

a switch circuit for inputting the signal of said output terminal of said Hall element and for outputting a signal selected by a signal comprising first and second phases given from the outside of said switch circuit;

an amplifier wherein at least one input terminal is connected to the output terminal of said switch circuit and a voltage gained amplifying the signal of this input terminal is outputted to an output terminal;

a first memory element of which one end is connected to said output terminal of said amplifier;

a switch of which one end is connected to the other end of said first memory element and which carries out opening and closing operations by means of said signal which comprises the first and the second phases given from the outside of said switch; and a signal output terminal connected to said other terminal of said first memory element, wherein said switch closes in said first phase so that said first memory element stores an output voltage of said amplifier and said switch opens in said second phase so that a vector sum of said voltage stored in said first memory element then an output voltage of said amplifier is outputted to said output terminal.

The present invention cancels the input offset voltage of the amplifier in a simple circuit. Thereby, a compact and inexpensive magnetic field sensor which receives no influence from that input offset voltage and which has little dispersion among products is attained.

In addition, the present invention attains a magnetic field sensor which consumes a small amount of power.

In the present specification and in the scope of the claims, the word "phase" means a timing along the time axis. The words "first phase" and "second phase" mean no more than being of mutually different timing along the time axis.

For example, in addition to the case where the "first phase" and the "second phase" occur repeatedly as in FIG. 7, or the like, the case where they occur only once when there is a request from the outside is included in the technical scope of the present invention.

Furthermore, in the present invention, the period of the repetition in the case that the "first phase" and the "second phase" occur repeatedly as in FIG. 7 or the like, the ratio of the length of the period of the first phase to that of the second phase, the length of the period which belongs to neither the first phase nor the second phase, or the like, do not matter. For example, a case where a magnetic field sensor is intermittently operated at long constant intervals is also included.

The invention according to claim 2 of the present invention is a magnetic field sensor according to claim 1, characterized in that:

said switch circuit comprises second and third memory elements; and in said first phase of said signal given from the outside of said switch circuit, the output voltage of the output terminal of said Hall element is stored in said second memory element and the voltage stored in said third memory element is given to said amplifier and, in said second phase, the voltage stored in said second memory element is given to said amplifier and the voltage of the output terminal of said Hall element is stored in said third memory element.

According to the present invention, in a simple circuit configuration, the differential voltage between the two terminals of the Hall element is, for example, converted into a voltage relative to the potential of one output terminal of the magnetic sensor so that the voltage relative to the potential of this one output terminal is inputted into a single output-type amplifier. The potential of this one output terminal may be a constant reference potential (including the ground) or may not be a reference potential.

In the present invention, a single output-type amplifier can be utilized in place of a conventional double output-type amplifier. The present invention wherein a single output-type amplifier is used has a smaller number of component elements of the output part than that of a double output-type amplifier and, therefore, occupies only a small chip area.

The present invention can attain a compact and inexpensive magnetic field sensor with a low power consumption.

The single output-type amplifier amplifies the inputted signal and outputs either one of the non-inverted output signal or the inverted output signal.

The invention according to claim 3 of the present invention is a magnetic field sensor according to claim 1 or 2, characterized in that at least one memory element among said memory elements is a capacitor.

According to the present invention, a magnetic field sensor uses a memory element, which is compact so as to be suitable for an IC. Thereby, a compact and inexpensive magnetic field sensor can be attained.

The invention according to claim 4 of the present invention is a magnetic field sensor according to claim 1 or 2, characterized in that:

said switch comprises first, second and third parallel connections wherein first and second conductive characteristics transistors are connected in parallel, and the connection between two terminals of said first and second conductive characteristics transistors are conducted or cut off by a binary signal given from the outside of said switch, wherein both ends of the second parallel connection are connected to one end of the first parallel connection; and both ends of the third parallel connection are connected to the other end of the first parallel connection; and the first conductive characteristics transistor in the first parallel connection is driven by a different value of the binary signal from a value of the binary signal for driving the first conductive transistors in the second and third parallel connections; and the second conductive characteristics transistor in the first parallel connection is driven by a different value of the binary signal from a value of the binary signal for driving the second conductive transistors in the second and third parallel connections.

According to the present invention, for example, at the time when a switch of MOS structure opens or closes in accordance with the change of the gate terminal of the switch, the charge stored in the parasitic capacitor across the gate and the source or across the gate and the drain of the switch can be prevented from flowing out into or flowing in from the memory element.

Thereby, a magnetic field sensor with little dispersion can be attained.

The invention according to claim 5 of the present invention is a magnetic field sensor according to claim 1 or 2, characterized in that at least one of the resistances for defining the gain of the amplifier is an element of which the manufacturing process is identical to that of the Hall element.

In a magnetic field sensor according to the present invention, at least one resistance among the resistances for defining the gain of the voltage amplifier is formed of an element of which the manufacturing process is identical to that of the Hall element, and the Hall element and the voltage amplifier are included in the same semiconductor chip.

When the resistance value of a Hall element is small, the resistance value of the resistance made of this identical element becomes small and the magnetic field sensor is configured so that the gain of the voltage amplifier becomes small as a result. On the contrary, when the resistance value of the Hall element is large, the resistance value of the resistance made of this identical element becomes large and the gain of the voltage amplifier becomes large as a result.

Thereby, the effect is obtained that a magnetic field sensor can be attained wherein the dispersion of the output voltage is smaller than the dispersion of the resistance value of the Hall element.

In the description of the present specification and the scope of the claims, "element of which the manufacturing process is identical" means an element produced through the same manufacturing process. For example, it means to go through the diffusion step of the identical impurities or to produce the identical N well. The differences in physical dimensions or forms of the elements do not matter. Accordingly, in the case that a Hall element and a resistance are the elements manufactured through the identical manufacturing process, they are the elements of which the manufacturing processes are identical even if the dimensions or the forms of the Hall element and the resistance are different.

The invention according to claim 6 of the present invention is a magnetic field sensor characterized by comprising:

a Hall element which outputs a signal in accordance with an applied magnetic field strength;

an amplifier which amplifies the output signal of this Hall element and outputs a voltage signal across a pair of output terminals;

a condenser of which both ends are connected to the pair of the output terminals of said amplifier;

a switch part which is inserted and makes a connection between one of said output terminals in the pair and one terminal of said condenser and which is closed by a first signal given from the outside of said switch part and is opened by a second signal given from the outside of said switch part; and an output terminal which outputs the voltages of both ends of said switch, respectively, wherein the polarities of the voltage signals for the pair of the output terminals of said amplifier during the period of said first signal and during the period of said second signal are mutually opposite polarities.

The present invention cancels the input offset voltage of the amplifier with a simple circuit. Thereby, a compact and inexpensive magnetic field sensor is attained which receives no influence of this input offset voltage and which has little dispersion among products.

The invention according to claim 7 of the present invention is a magnetic field sensor characterized by comprising:

a Hall element which outputs signals to first and second terminal pairs in accordance with an applied magnetic field strength;

first and second condensers;

a first connection part which connects terminals of said first terminal pair and both ends of said first condenser, respectively;

a second connection part which connects terminals of said second terminal pair and both ends of said second condenser, respectively;

a first switch part which is inserted and makes a connection in said first connection part and which closes this first connection part by means of a first signal given from the outside of said first switch part and opens this first connection part by means of a second signal given from the outside of said first switch part;

a second switch part which is inserted and makes a connection in said second connection part and which opens this second connection part by means of said first signal given from the outside of said second switch part and closes this second connection part by means of said second signal given from the outside of said second switch part;

an amplifier which amplifies a signal given to an input terminal so as to output to an output terminal;

a first output terminal;

a third connection part which connects both ends of said first condenser to the input terminal of said amplifier as well as to said first output terminal, respectively;

a fourth connection part which connects both ends of said second condenser to the input terminal of said amplifier as well as to said first output terminal, respectively;

a third switch part which is inserted and makes a connection in said third connection part and which opens this third connection part by means of said first signal given from the outside of said third switch part and closes this third connection part by means of said second signal given from the outside of said third switch part:

a fourth switch part which is inserted and makes a connection in said fourth connection part and which closes this fourth connection part by means of said first signal given from the outside of said fourth switch part and opens this fourth connection part by means of said second signal given from the outside of said fourth switch part;

a second output terminal;

a third condenser of which one end is connected to the output terminal of said amplifier and of which the other end is connected to said second output terminal; and a fifth switch part of which both ends are connected respectively to said first and second output terminals and which is closed by said first signal given from the outside of said fifth switch part and is opened by said second signal given from the outside of said fifth switch part;

wherein a signal is extracted across said first and second output terminals.

The present invention converts a differential voltage between two terminals of the Hall element into a voltage from the potential of one output terminal of the magnetic field sensor with a simple circuit configuration, and inputs this voltage from the potential of one output terminal of the magnetic field sensor into a single output-type amplifier. As for the amplifier which amplifies the voltage from the potential of one output terminal of the magnetic field sensor, a single output-type amplifier can be utilized.

The potential of one output terminal of the magnetic field sensor may be a constant reference potential or may not be a constant reference potential.

The present invention cancels the input offset voltage of the amplifier with a simple circuit. Thereby, a compact and inexpensive magnetic field sensor is attained which receives no influence of this input offset voltage and which has little dispersion among products.

The invention according to claim 8 of the present invention is a magnetic field sensor according to claim 7, characterized by comprising:

a comparator that converts the results of the comparison of the differential signal of said input signals which enter from said first output terminal and said second output terminal respectively with a predetermined voltage into binary signals so as to output; and a latch circuit which inputs the output signal of said comparator and said second signal, and outputs either value of said binary signal, synchronized with one phase of said second signal.

The invention according to claim 8 can, additionally, latch the input voltage at the timing when the second phase ends and can output a constant digital value of 0 or 1.

The invention according to the present invention is a magnetic field sensor characterized by comprising:

a Hall element which outputs a signal in accordance with an applied magnetic field strength;

an amplifier which amplifies the output signal of this Hall element and outputs a voltage signal to an output terminal pair;

a condenser of which respective terminals are connected to the terminals of the output terminal pair of said amplifier;

a switch which is inserted to make a connection with one terminal of said output terminal pair and one terminal of said condenser and which is closed by a first signal given from the outside of said switch and is opened by a second signal given from the outside of said switch;

output terminals which output voltages of both ends of said switch respectively;

a comparator which inputs signals of these output terminals respectively and converts the results of the comparison of the differential signal of said input signals with a predetermined voltage into a binary signal so as to output; and a latch circuit which inputs said binary signal and said second signal, and outputs either value of said binary signal, synchronized with one phase of said second signal, wherein the polarities of the voltage signals of the output terminal pair of said amplifier between the period of said first signal and the period of said second signal are of mutually opposite polarities.

The invention can cancel the input offset voltage of the amplifier with a simple circuit and can latch the input voltage at the timing when the second phase ends so as to output a constant digital value of 0 or 1.

The invention according to the present invention is a magnetic field sensor, characterized in that predetermined voltage of said comparator varies depending on the output signal of said latch circuit.

The invention can extract from a comparator, a signal which is stable against noise signals and of which the chattering is suppressed by providing the reference value set for the judgment by the comparator with a hysteresis. By giving this signal to a latch circuit, a stable signal which has a high judgment precision can be extracted from the latch circuit.

Though the novel characteristics of the invention are nothing more than the particular description in the attached claims, the present invention with respect to both the configuration and the contents, together with other purposes or characteristics, will be better understood and evaluated by means of the following detailed description which is to be understood in conjunction with the drawings.

It must be taken into account that part of, or the entirety of, the drawings are depicted in schematic representation for the purpose of illustration and do not, necessarily, faithfully depict the relative sizes or the positions of the elements therein.

DETAILED DESCRIPTION OF THE INVENTION

In the following, embodiments of the present invention are described in reference to the drawings.

<<Embodiment 1>>

Figure 1:
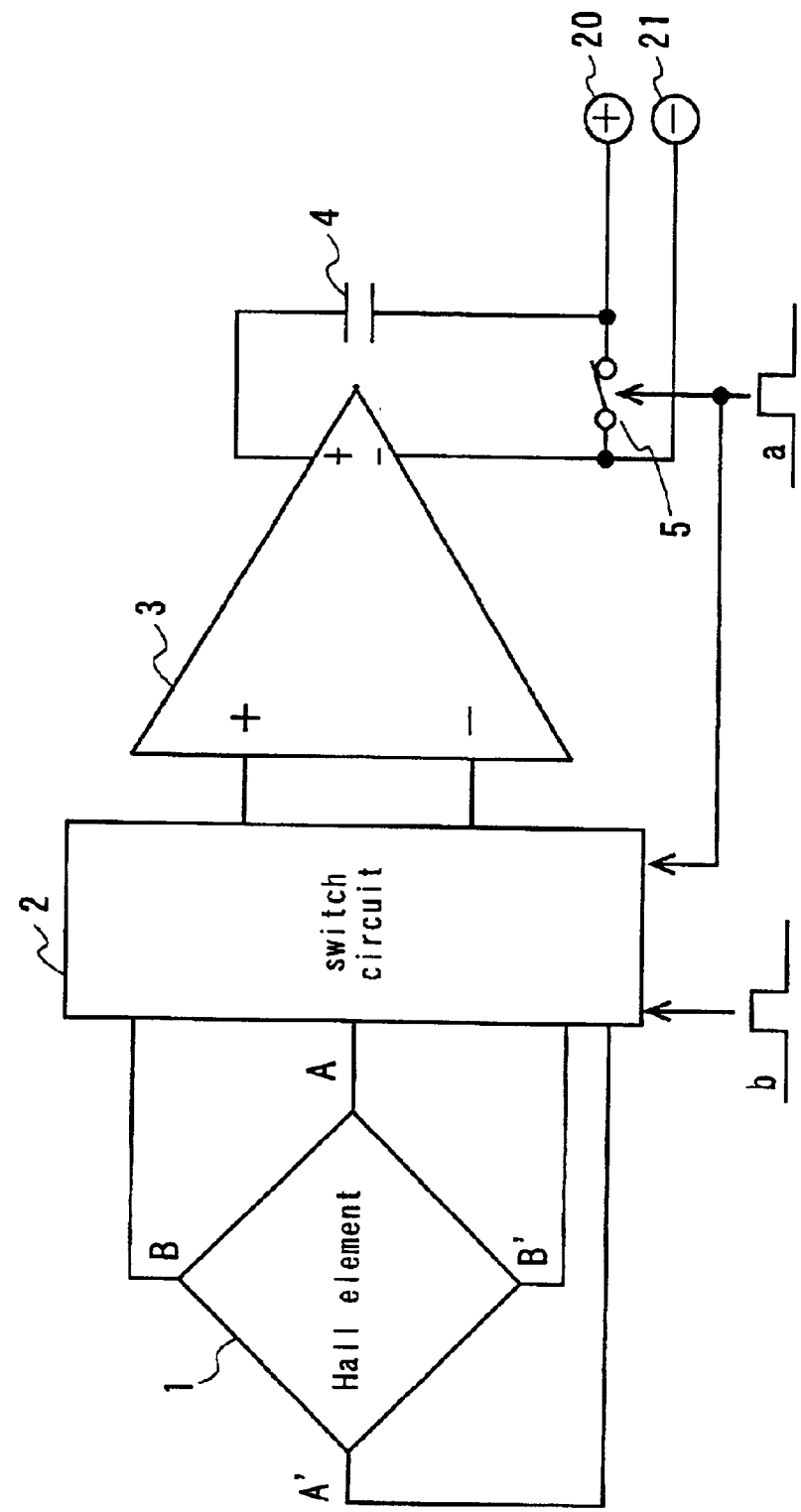
FIG. 1 is a configuration diagram of a magnetic field sensor according to the first embodiment of the present invention.

FIG. 1 shows a configuration of a magnetic field sensor according to the first embodiment of the present invention. In FIG. 1, a Hall element is denoted as 1, a switch circuit is denoted as 2, a voltage amplifier is denoted as 3, a capacitor which is a memory element is denoted as 4 and a switch is denoted as 5.

The Hall element 1 is a Hall element in a plate form with four terminals, and the form of the Hall element 1 is geometrically equivalent.

The first phase signal (a) that has a pulse in the first phase is given to the switch 5 and the switch circuit 2. The second phase signal (b) that has a pulse in the second phase is given to the switch circuit 2.

Figure 7:
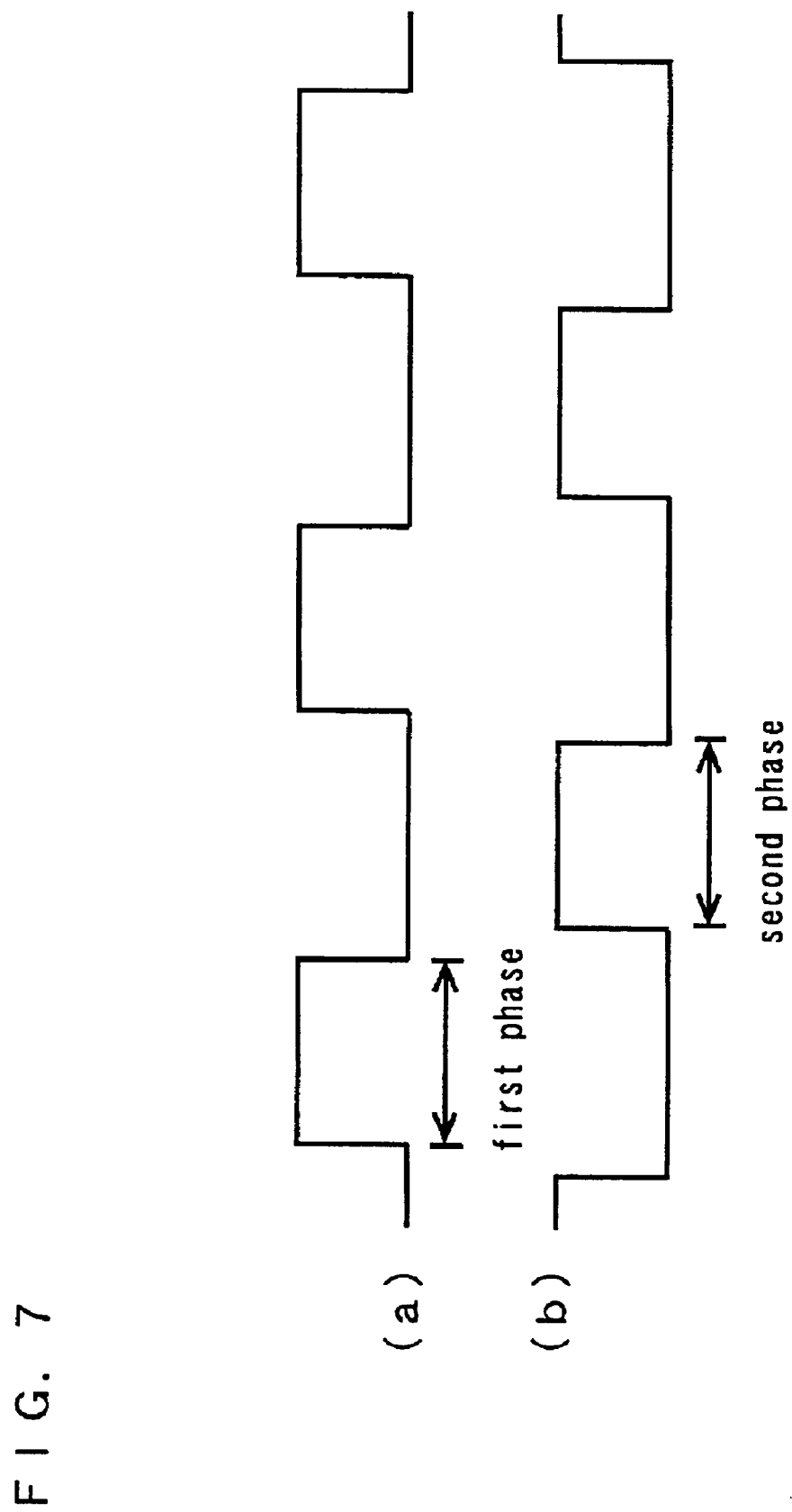
FIG. 7 is a timing chart according to the first prior art as well as the first, the second and the third embodiments.

The timing chart in the first embodiment is shown in FIG. 7.

With respect to the magnetic field sensor constructed as the above, the operation is described in the following.

The operation of the first phase is described.

In the first phase, the switch 5 is closed.

At this time, a power source voltage is applied across the terminals A–A' of the Hall element 1, and the output voltage across the terminals B–B' is outputted through the switch circuit 2. The output voltage of this Hall element 1 is inputted into the voltage amplifier 3.

The voltage amplifier 3 outputs the voltage which is proportional to the output voltage Vh of the Hall element 1. The output voltage V1 of the voltage amplifier 3 in the first phase can be represented in the following equation:

$$V1 = \beta(Vh + Voff3) \tag{9}$$

Voff3 is an input offset voltage of the voltage amplifier 3 while β is a voltage amplification factor of the voltage amplifier 3. Both ends of the capacitor 4 are charged to the output voltage V1 of the voltage amplifier 3 via the switch 5.

Next, the operation in the second phase is described.

In the second phase, the switch 5 is open.

The power source voltage is applied across the terminals B–B' of the Hall element 1 and the output voltage across the terminals A–A' is outputted via the switch circuit 2. The output voltage of this Hall element 1 is inputted to the voltage amplifier 3. The output signal of this Hall element which is inputted into the input terminal of the voltage amplifier 3 becomes, substantially, of the opposite direction to that in the first phase. Accordingly, at this time, the output voltage V2 of the voltage amplifier 3 can be represented in the following equation:

$$V2 = \beta(-Vh + Voff3) \tag{10}$$

In the second phase, the voltage across the terminals of the capacitor 4 is maintained and is added in vector to the output voltage of the voltage amplifier 3. The signal V, as a result of vector addition, is outputted from the output terminals 20, 21.

Accordingly, the output voltage V of the first embodiment in FIG. 1 can be represented in the following equation:

$$V = -V1 + V2 = -2\beta Vh \tag{11}$$

It can be seen that, in the output voltage V, the input offset voltage Voff3 is canceled.

Figure 5:
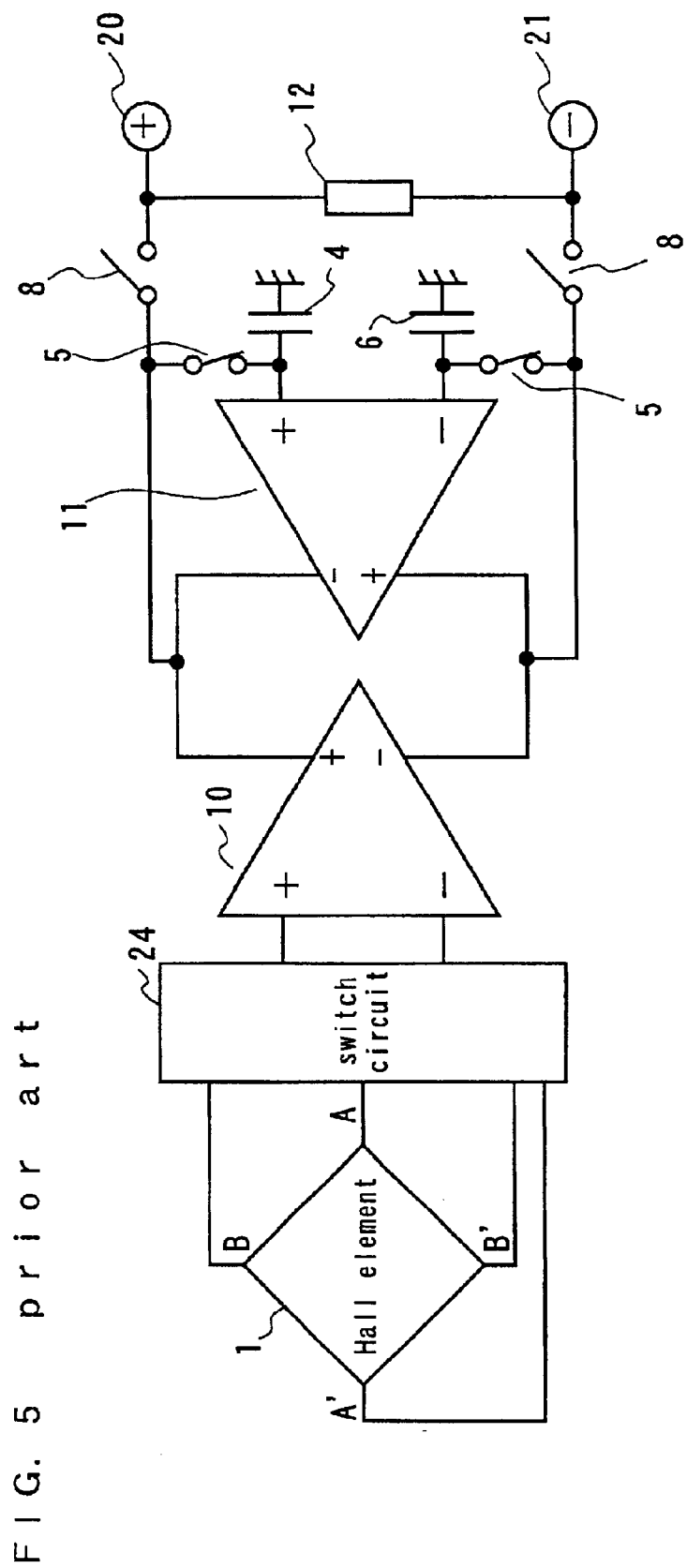
FIG. 5 is a configuration diagram of a magnetic field sensor according to the first prior art.

Judging from the comparison of the equations (4), (8) and (11), though all of the input offset voltages Voff are canceled in the same manner, the magnetic field sensor according to the present invention has a more compact and simpler circuit configuration in comparison with the prior art of FIG. 5.

Figure 6:
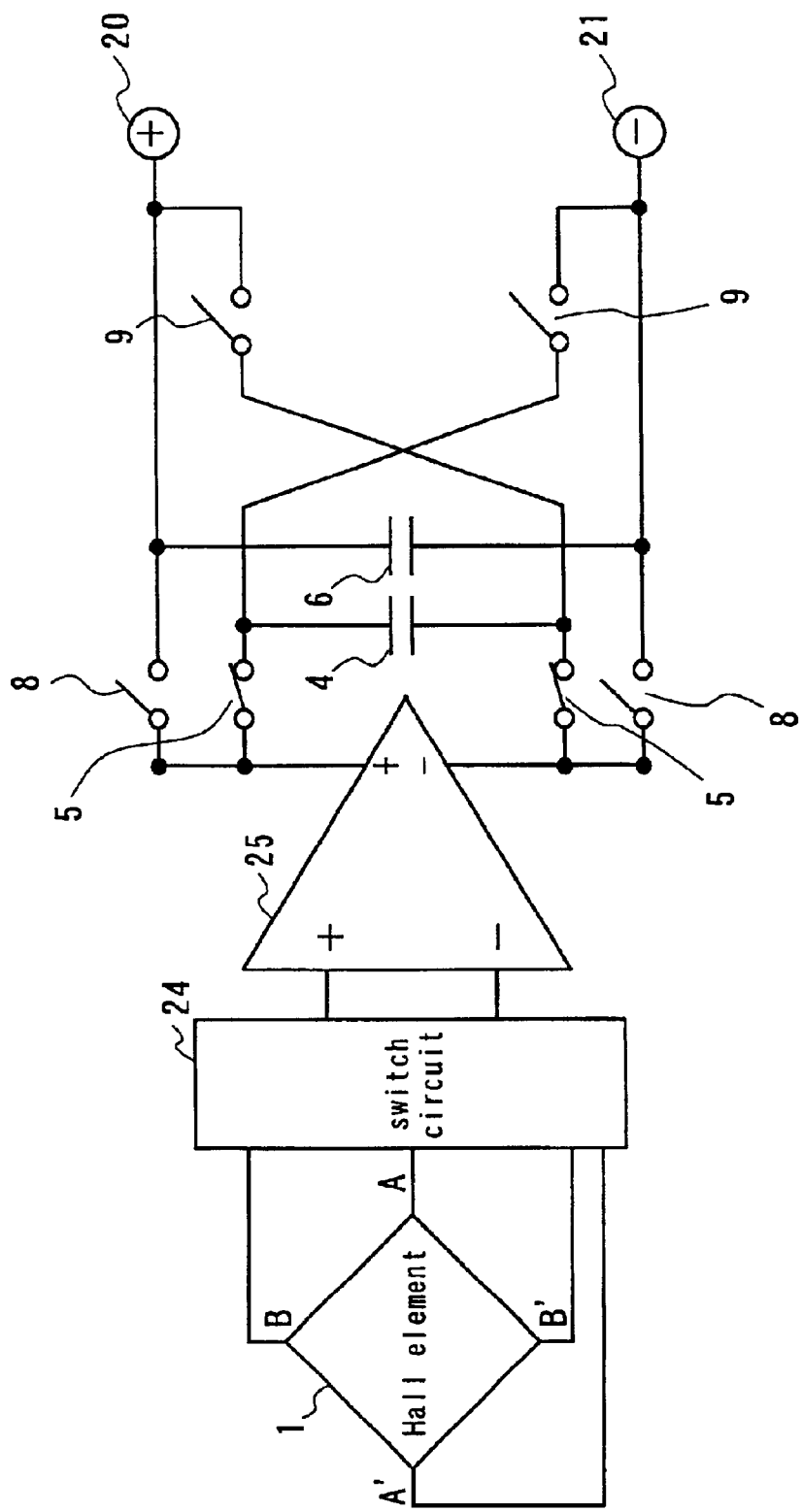
FIG. 6 is a configuration diagram of a magnetic field sensor according to the second prior art.
Figure 8:
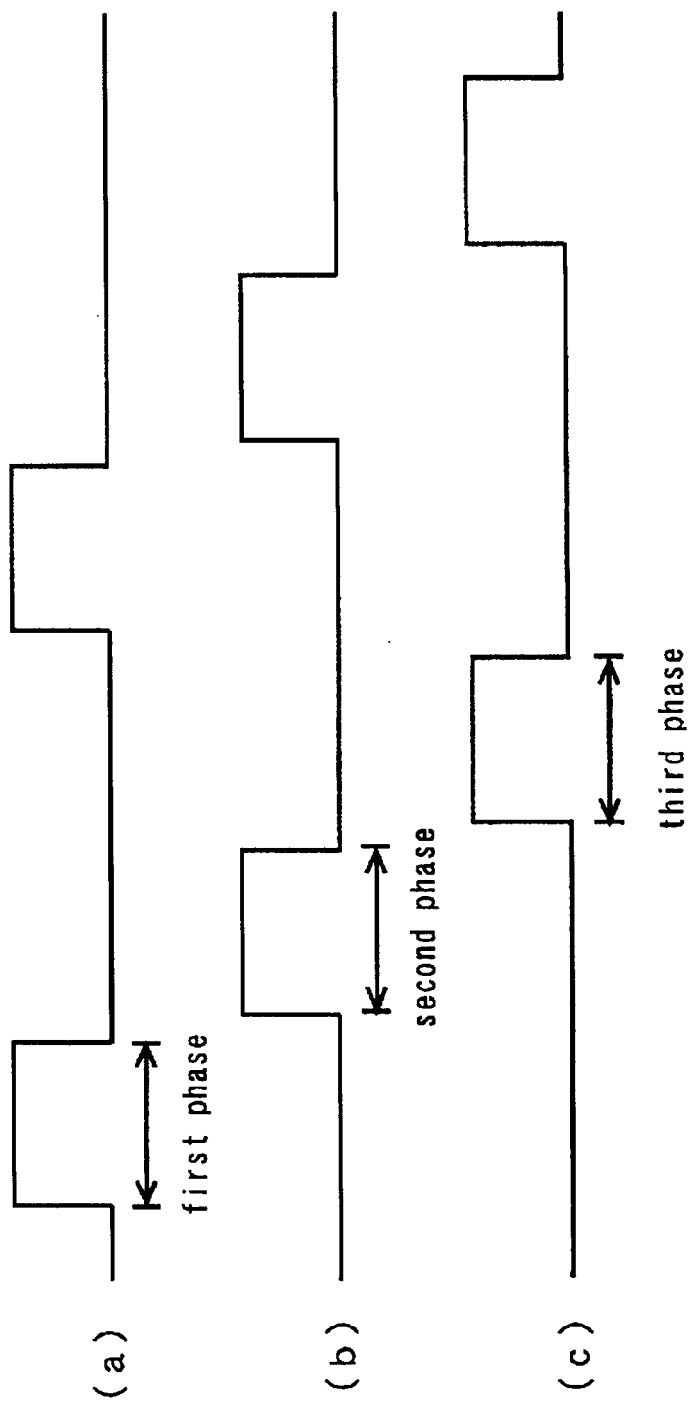
FIG. 8 is a timing chart according to the second prior art.

In addition, the present invention outputs an amplified signal of the detected signal by the Hall element in two steps (first phase and second phase), which is fewer than the number of steps (three) of the second prior art as shown in FIGS. 6 and 8.

For example, in a device, wherein a magnetic field sensor of the present invention is applied, which outputs an amplified signal of the detection signal by the Hall element once for every constant period, power consumption can be reduced during a constant period in comparison with the device which uses a magnetic field sensor in FIG. 6 by halting the power source supply to the magnetic field sensor during the period when the magnetic field sensor is not in operation.

<<Embodiment 2>>

Figure 2:
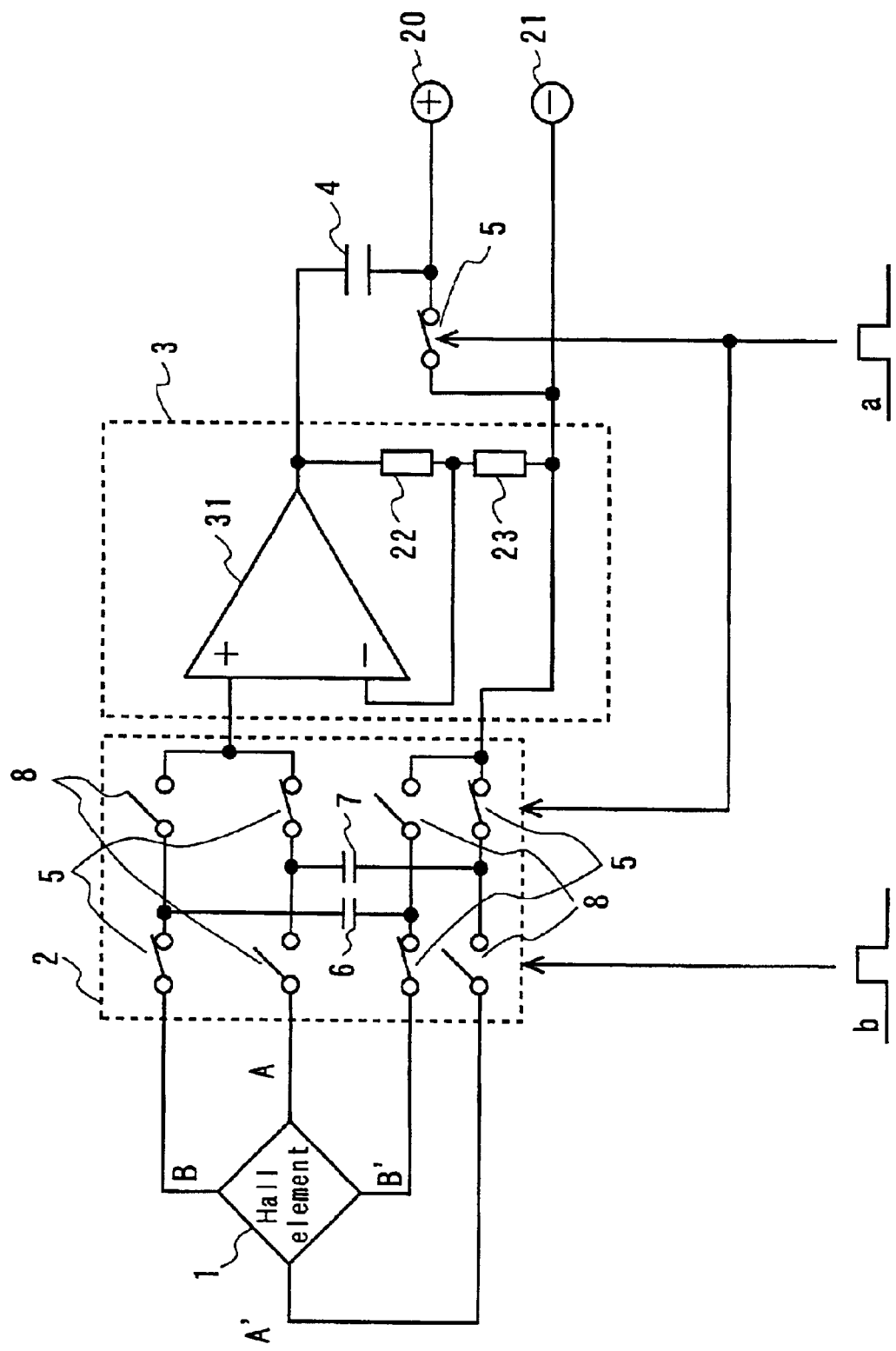
FIG. 2 is a configuration diagram of a magnetic field sensor according to the second embodiment of the present invention.

FIG. 2 shows a configuration of a magnetic field sensor according to the second embodiment of the present invention. In FIG. 2 a Hall element is denoted as 1, a switch circuit is denoted as 2, a voltage amplifier is denoted as 3, capacitors which are memory elements are denoted as 4, 6 and 7, and switches are denoted as 5 and 8.

The Hall element 1 is a Hall element in a plate form with four terminals, and the form of the Hall element 1 is geometrically equivalent.

The voltage amplifier 3 is formed of a single input amplifier and two resistances 22, 23 which define the amplification factor (feed back amount). This is the same as the voltage amplifier 3 of the first embodiment with respect to the function which outputs a voltage proportional to the input voltage.

In the first phase, the first phase signal (a) which has a pulse is given to the switch 5 (including the switch 5 which forms a part of the switch circuit 2) and a changing switch of a circuit which applies the power source voltage to the Hall element 1 (included in the switch circuit 2 and not shown). In the second phase, the second phase signal (b) which has a pulse is given to the switch 8 (forming a part of the switch circuit 2) and a changing switch of a circuit which applies the power source voltage to the Hall element 1 (included in the switch circuit 2 and not shown).

The timing chart in the second embodiment is the same as the timing chart of FIG. 7.

As for the magnetic field sensor formed as above, the operation is described in the following.

The operation in the first phase is described. In the first phase, the switch 5 is closed while the switch 8 is open.

At this time, the power source voltage is applied across the terminals A–A' of the Hall element 1 and the output voltage Vh across the terminals B–B' is outputted to the switch circuit 2. The output voltage Vh of this Hall element 1 is applied to the capacitor 6 through the switch 5 so as to charge the capacitor 6.

At this time, the voltage across both ends of the capacitor 7 is inputted into the input terminal of the voltage amplifier 3 through the switch 5.

One input terminal of a single output-type voltage amplifier 31 which forms the amplifier 3 is connected to one output terminal of the magnetic field sensor.

The single output-type voltage amplifier 31 outputs a voltage proportional to the voltage across both ends of the capacitor 7. As described below, the voltage across both ends of the capacitor 7 is Vh. The output voltage V1 of the voltage amplifier 3 in the first phase can be represented in the following equation. This is the same as the above equation (9).

$$V1 = (Vh + Voff3) \tag{12}$$

Here, β, Vh and Voff3 are defined in the same manner as in the first embodiment.

Both ends of the capacitor 4 are charged to the output voltage V1 of the voltage amplifier 3 via the switch 5.

Next, the operation in the second phase is described.

In the second phase, the switch 8 is closed while the switch 5 is open.

At this time, the power source voltage is applied across the terminals B–B' of the Hall element 1 and the output voltage Vh across the terminals A–A' is outputted to the switch circuit 2. The output voltage Vh of this Hall element 1 is applied to the capacitor 7 through the switch 8 so as to charge the capacitor 7.

At this time, the voltage across both ends of the capacitor 6 is inputted to the input terminal pair (input terminal of the single output-type voltage amplifier 31 and minus output terminal 21 of the magnetic field sensor) of the voltage amplifier 3 through the switch 8.

The single output-type voltage amplifier 31 outputs a voltage proportional to the voltage across both ends of the capacitor 6. The voltage across both ends of the capacitor 6 is Vh. The output voltage V2 of the voltage amplifier 3 in the second phase can be represented in the following equation. This is the same as the above equation (10).

$$V2 = \beta(-Vh + Voff3) \quad (13)$$

In the second phase, the voltage across the terminals of the capacitor 4 is maintained and is added in vector to the output voltage of the voltage amplifier 3. The signal V as a result of the vector addition is outputted from the output terminals 20, 21.

Accordingly, the output voltage V of the second embodiment in FIG. 2 can be represented in the following equation.

$$V = -V1 + V2 = -2\beta Vh \quad (14)$$

It can be seen that, in the output voltage V, the input offset voltage Voff3 is canceled.

The magnetic field sensor of the second embodiment repeatedly carries out the above operation.

In this manner, according to the present invention, the output voltage Vh across the output terminals B–B' is once stored in the capacitor 6 in the first phase. In the second phase, the connection between the capacitor 6 and the Hall element is cut and one terminal of the capacitor 6 is connected to the minus output terminal 21 of the magnetic field sensor while the other terminal of the capacitor 6 is connected to the non-inverted (plus) input terminal of the single output-type amplifier 31.

In the same manner, the output voltage across the output terminals A–A' is stored in the capacitor 7 in the second phase. In the first phase, the connection between the capacitor 7 and the Hall element is cut and one terminal of the capacitor 7 is connected to the minus output terminal 21 of the magnetic sensor while, at the same time, the other terminal is connected to the non-inverted input terminal of the single output-type amplifier 31.

Since the capacitor 6 maintains the voltage across both terminals before and after the connection switching of both terminals, the output voltage Vh across the terminals A–A' and B–B' of the Hall element 1 is converted to the voltage Vh with the potential of the minus output terminal 21 as a reference (conversion of the offset level).

Thereby, a single output-type amplifier of a single input can be utilized as the voltage amplifier 3 in place of a double output-type amplifier of a differential input.

The potential of said minus output terminal may be the reference potential or may not be a reference potential. A plus output terminal may be used in place of the minus output terminal (in this case, the output signal of the single output amplifier is outputted from the minus output terminal).

In the second embodiment, after disconnecting the capacitor 6 or 7 from the Hall element 1, the voltage across both ends of the capacitor 6 or 7 is inputted to the single output-type amplifier 31. Thereby, the differential voltage between the two terminals of the Hall element can be maintained and the disconnected Hall element 1 can operate normally.

In this manner, a single output-type amplifier can be utilized in place of a conventional double output-type amplifier.

In addition, in a magnetic field sensor of which the potential of the minus output terminal is not a constant reference potential (including the ground) a single output-type amplifier can be utilized according to the present invention.

Preferably, feed through measures are taken for the switches of Embodiment 1 or Embodiment 2. The switches, for which the feed through measures are taken, prevent the charge stored in the parasitic capacitance across the gate and the source, or across the gate and the drain of the switches, from flowing out into or flowing in from the capacitor 6 or 7 when the gate terminals of these switches are changed.

Figure 4:
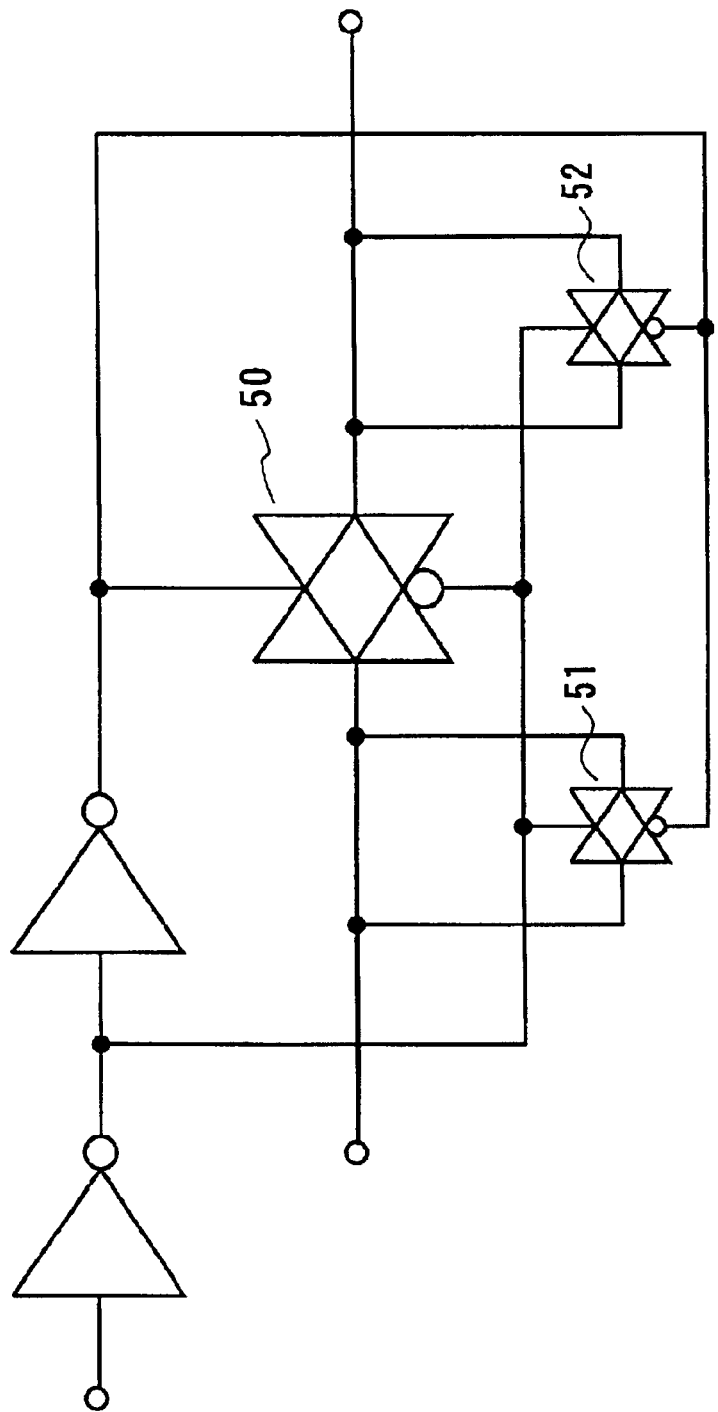
FIG. 4 is a configuration diagram of a switch according to the present invention.

FIG. 4 is a diagram wherein feed through measures are taken for a bi-directional switch 50 of the MOS structure, of which the gate is driven by a binary voltage.

In the switches 50, 51 and 52, N channel and P channel MOS transistors are connected in parallel, while the gate of each transistor is driven by a binary voltage given from the outside of these switches. Here, the input and output parts of the switches 51 and 52 are connected in common. In addition, the switch 51 is connected to one of the input/output part of the switch 50 while the switch 52 is connected to the other input/output part of the switch 50. When the voltage of the gate terminal of the switch 50 changes, the charge moves which is stored in the parasitic capacitance across the source, the drain and the gate of each of the N channel and P channel MOS transistors of the switch 50. Therefore, the switches 51, 52 are driven by a binary voltage of the polarity that is opposite to that of the binary voltage which drives the switch 50. Thereby, the charge of the parasitic capacitance in the switches 51, 52 is moved in the direction opposite to that of the switch 50. Through this movement of the charge, the movement of the charge in the switch 50 can be canceled.

Preferably, at least one of the resistances which define the gains of the voltage amplifiers of Embodiment 1 or Embodiment 2 is formed of the same material as that of the Hall element. For example, citing the voltage amplifier 3 of FIG. 2 as an example, the resistance 22 inserted between the output terminal of the single output-type amplifier 31 and the inverted (minus) input terminal of amplifier is formed of the same element as the Hall element 1.

For example, N-type impurities are diffused into a P-type semiconductor substrate so as to form a Hall element and a resistance 22 and a resistance 23 is formed of a polysilicon resistance which has little dispersion.

In a magnetic field sensor which includes a Hall element 1 and a voltage amplifier 3 on the same semiconductor chip, when the resistance value of the Hall element 1 is small, the output voltage of the Hall element 1 becomes large, the resistance value of this resistance 22, which is made of the same element, also becomes small and, as a result, the gain of the voltage amplifier 3 becomes small. On the contrary, when the resistance value of the Hall element 1 is large, the output voltage of the Hall element 1 becomes small, the resistance value of this resistance 22, which is made of the same element, also becomes large and, as a result, the gain of the voltage amplifier 3 becomes large.

Thereby, the gain of the voltage amplifier 3 suppresses the dispersion of the output voltage of the terminals 20, 21 in accordance with the dispersion of the output voltage of the Hall element 1 due to the dispersion of the resistance value of the Hall element 1. A magnetic field sensor of which the output voltage dispersion of the terminals 20, 21 is small, can be attained.

<<Embodiment 3>>

Figure 3:
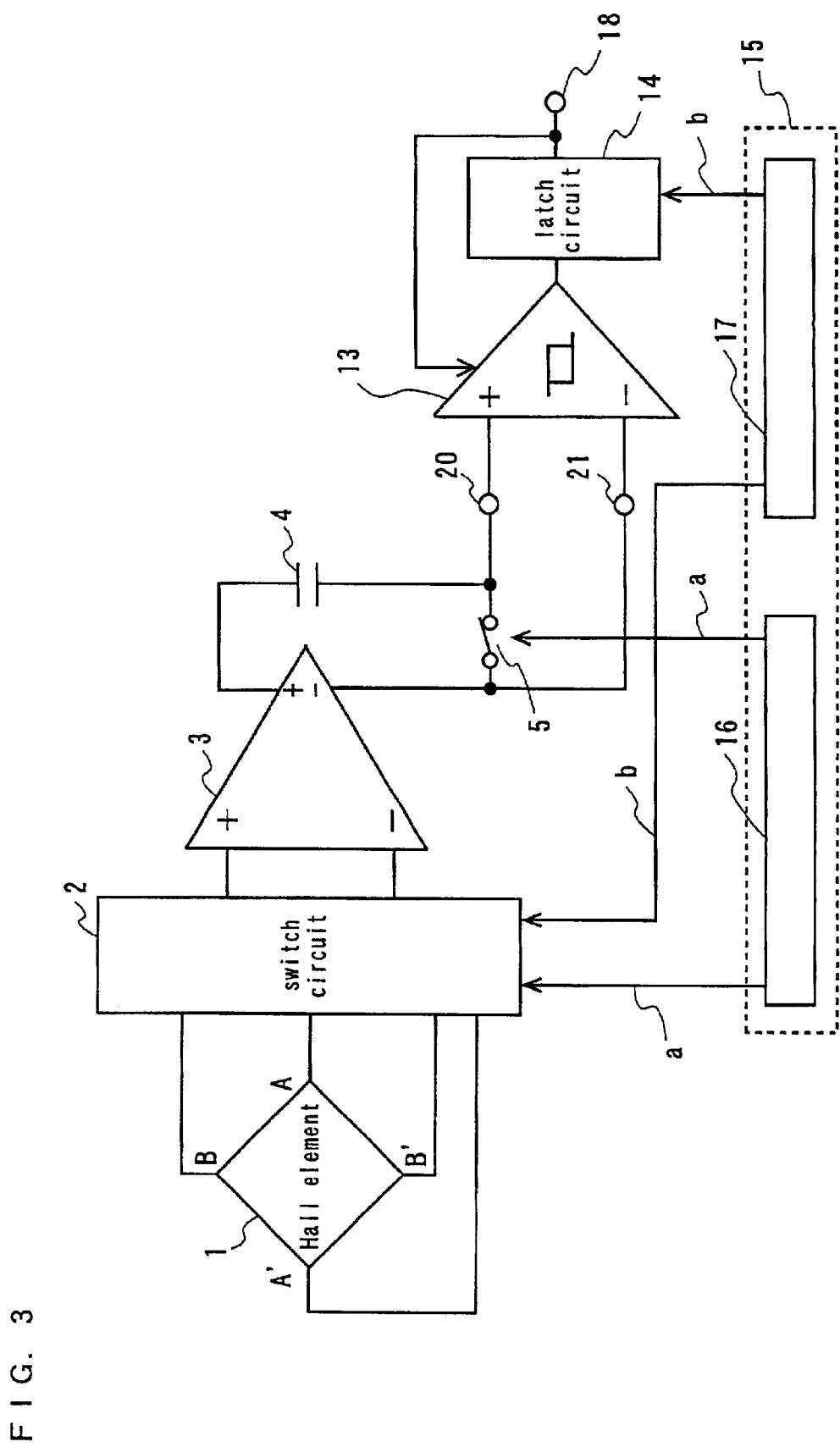
FIG. 3 is a configuration diagram of a magnetic field sensor according to the third embodiment of the present invention.

FIG. 3 illustrates a magnetic field sensor of the third embodiment which uses the magnetic field sensor of the first embodiment according to the present invention. The magnetic field sensor of the third embodiment outputs a binary digital signal of 0 or 1 in accordance with the intensity of the magnetic field.

In FIG. 3, a Hall element is denoted as 1, a switch circuit is denoted as 2, a voltage amplifier is denoted as 3, a capacitor which is a memory element is denoted as 4, a switch (which is closed in the first phase and is open in the other phase) is denoted as 5, a comparator is denoted as 13, a latch circuit is denoted as 14, a clock generation circuit is denoted as 15, the first phase clock generation circuit is denoted as 16 and the second phase clock generation circuit is denoted as 17.

The Hall element 1 has a plate form with four terminals, and the form of the Hall element 1 is geometrically equivalent.

(a) in FIG. 7 shows a waveform (including the first phase) of the output signal obtained from the first phase clock generation circuit 16 while (b) in FIG. 7 shows a waveform (including the second phase) of the output signal obtained from the second phase clock generation circuit 17.

With respect to the magnetic field sensor formed as described above, the operation is described in the following.

In this description, the case is assumed that a constant magnetic field passes through the Hall element 1 and the output voltage of the Hall element is constant when the offset is not taken into consideration.

First, a clock which determines the first phase is generated in the first phase clock generation circuit 16. Next, by using this clock, a voltage is applied across the terminals which make a pair on a diagonal line of the Hall element 1, so that an output voltage of the Hall element which is proportional to the magnetic field strength is generated across the other two terminals. The switch circuit 2 is operated so that this output voltage is applied to the two input terminals of the voltage amplifier 3. At this time, a voltage which is proportional to the output voltage of the Hall element 1 is generated in the output of the voltage amplifier 3, which is taken into the capacitor 4 via the switch 5 controlled by the first phase clock generation circuit 16. After the end of the first phase, the switch circuit 5 is opened and the output voltage of the voltage amplifier 3 in the first phase is maintained in the capacitor 4.

Next, a clock which determines the second phase is generated in the second phase clock generation circuit 17. Next, by using this clock, a voltage is applied across the terminals of the Hall element 1 wherein the output voltage across these terminals of the Hall element is measured in the first phase, and the other two terminals are connected to the voltage amplifier 3. In addition, the switch circuit 2 is operated so that the output voltage of the Hall element, which has opposite polarity (positive or negative) to that in the first phase, is given to the input of the voltage amplifier 3. At this time, the output voltage from the voltage amplifier 3 is the reverse voltage of that in the first phase. In addition, since the switch 5 is open, the vector sum of the output voltage of the voltage amplifier 3 in the first phase which is stored in the capacitor 4 and the output voltage of the voltage amplifier 3 in the second phase is connected across the input terminals of the comparator 13.

Then, the differential voltage applied to the input terminals of the phase comparator 13 in this second phase becomes, as described above, −2 Vh with the input offset voltage Voff3 being canceled.

This value is compared with the reference value set in the comparator 13 and the judgment result (A digital signal is 0 in the case that this value is smaller than the reference value and a digital signal is 1 in the case that this value is larger than the reference value.) is outputted to the output terminal of the comparator 13.

The latch circuit 14 is connected to the second phase clock generation circuit 17 and is set so as to latch the input voltage at the end timing of the second phase. Accordingly, a constant value (digital value of 0 or 1), which is maintained until the end time of the next second phase, is outputted to the output terminal 18.

In addition, it is preferable to return the output value of this output terminal 18 to the comparator 13 so as to set a hysteresis in the judgment reference value for chattering prevention.

The present invention cancels the input offset voltage of the amplifier with a simple circuit. Thereby, the advantageous effects can be obtained attaining a compact and inexpensive magnetic field sensor which receives no influence of that input offset voltage and has little dispersion.

In addition, according to the present invention, an advantageous effect can be obtained attaining a magnetic field sensor of low power consumption.

The present invention converts the output signal of the differential voltage of the Hall element into a voltage relative to the reference potential, or the like, with a simple circuit and inputs this voltage, relative to the reference potential, or the like, into a single output-type amplifier.

Thereby, a magnetic field sensor is attained wherein the output signal of the differential voltage of the magnetic field sensor is amplified by a single output-type amplifier of which the circuit of the output part is simple and occupies a small chip area.

According to the present invention, an advantageous effect can be obtained attaining a compact and inexpensive magnetic field sensor.

According to the present invention, a magnetic field sensor can be attained wherein a compact memory element is used, which is suitable for an IC. Thereby, an advantageous effect can be obtained attaining a compact and inexpensive magnetic field sensor.

According to the present invention, an advantageous effect can be obtained attaining a magnetic field sensor of which the dispersion of the output voltage due to the dispersion of the capacitance of the capacitor is small.

According to the present invention, an advantageous effect can be obtained attaining a magnetic field sensor wherein the dispersion of the output voltage is smaller than the dispersion of the resistance value of the Hall element.

Though the invention is described with respect to preferable modes, to a certain degree of detail, the present disclosure contents of those preferable modes should be changed in the details of the configuration and the modification of the combination or the order of respective elements can be attained without deviating from the claimed scope and the spirit of the invention.

What is claimed is:

1. A magnetic field sensor characterized by comprising:
   a magnetic field element which outputs a signal in accordance with an applied magnetic field strength;
   an amplifier which amplifies the output signal of this magnetic field element and outputs a voltage signal across a pair of output terminals;
   a condenser of which both ends are connected to the pair of output terminals of said amplifier;
   a switch which is inserted and makes a connection between one of said output terminals in the pair and one terminal of said condenser and which is closed by a first period of a signal given from an outside of said switch and is opened by a second period of a signal given from the outside of said switch; and
   a pair of output terminals which outputs the voltage across the ends of said switch
   wherein the polarities of the voltage signals for the pair of output terminals of said amplifier at the first period of said signal and at the second period of said signal are mutually opposite polarities.

2. A magnetic field sensor according to claim 1, characterized in that the magnetic field element is a Hall element.

3. A magnetic field sensor characterized by comprising:
   a magnetic field element which outputs a signal in accordance with an applied magnetic field strength;
   an amplifier which amplifies a signal from this magnetic field element, which polarities in a first signal period and in a second signal period are mutually opposite, and outputs a voltage signal across a pair of output terminals;
   a condenser of which both ends are connected to the pair of output terminals of said amplifier;
   a switch which is inserted and makes a connection between one of said output terminals in the pair and one terminal of said condenser, and which is closed at the first signal period and is opened at the second signal period; and
   a pair of output terminals which outputs the voltage across the ends of said switch.

4. A magnetic field sensor according to claim 3, characterized in that the magnetic field element is a Hall element.

5. A magnetic field sensor according to claim 3, characterized by further comprising a switch circuit which switches the voltage outputted from said magnetic field element to have opposite polarities in a first signal period and a second signal period and which outputs the switched voltage.

6. A method for detecting magnetic field comprising the steps of:
   (a) outputting a signal according to an applied magnetic field strength through a magnetic field element;
   (b) amplifying a signal of a first signal period of a polarity from this magnetic field element for outputting a voltage signal across a pair of output terminals of an amplifier and inputting a signal of the pair of output terminals of the amplifier to both ends of a condenser; and
   (c) amplifying a signal of a second signal period of the other polarity from this magnetic field element for outputting a voltage signal across a pair of output terminals of the amplifier and inputting a signal of one output terminal in the pair to one end of the condenser, and outputting a signal across the other end of the condenser and the other output terminal of the amplifier to a second pair of output terminals, respectively.

7. A method for detecting magnetic field according to claim 6, characterized in that the magnetic field element outputs a signal in accordance with a Hall effect.

8. A method for detecting magnetic field according to claim 6, characterized by further comprising a step of:
   (d) halting a power source supply to the magnetic field sensor in every constant period.

* * * * *